United States Patent
Moyer et al.

[11] Patent Number: 6,052,302
[45] Date of Patent: Apr. 18, 2000

[54] BIT-WISE CONDITIONAL WRITE METHOD AND SYSTEM FOR AN MRAM

[75] Inventors: William C. Moyer, Dripping Springs; Jeffrey Van Myers, Driftwood; Noel R. Strader, II, Austin, all of Tex.

[73] Assignee: Motorola, Inc., Schaumburg, Ill.

[21] Appl. No.: 09/406,425

[22] Filed: Sep. 27, 1999

[51] Int. Cl.[7] ................................................. G11C 11/15
[52] U.S. Cl. ........................... 365/173; 365/158; 365/171
[58] Field of Search .................................. 365/173, 170, 365/171, 158

[56] References Cited

U.S. PATENT DOCUMENTS

| | | | |
|---|---|---|---|
| 5,289,410 | 2/1994 | Katti et al. | 365/170 |
| 5,295,097 | 3/1994 | Lienau | 365/170 |
| 5,329,480 | 7/1994 | Wu et al. | 365/170 |
| 5,396,455 | 3/1995 | Brady et al. | 365/170 |
| 5,477,482 | 12/1995 | Prinz | 365/129 |
| 5,565,695 | 10/1996 | Johnson | 257/295 |
| 5,587,943 | 12/1996 | Torok et al. | 365/158 |
| 5,699,293 | 12/1997 | Tehrani et al. | 365/158 |
| 5,917,749 | 6/1999 | Chen et al. | 365/173 |
| 5,936,882 | 8/1999 | Dunn | 365/158 |

OTHER PUBLICATIONS

Roy E. Scheuerlein, "Magneto–Resistive IC Memory Limitations and Architecture Implications", 1998 IEEE International NonVolatile Memory Technology Conf., pp. 47–50.

*Primary Examiner*—Vu A. Le

[57] ABSTRACT

A bit-wise conditional write method and apparatus to minimize power consumption in integrated circuit (IC) magnetoresistive random access memory (MRAM) systems. In a first embodiment, the current logic state of each data bit of a word stored in the MRAM is compared to a corresponding input bit and only those stored data bits which are different are written. In a second embodiment, for each stored data bit which is not being written, the current logic state is guarded against inadvertent modification when other data bits of the word are written. In a third embodiment, if the logic states of a majority of the stored data bits comprising a word are different from the logic states of the respective input bits, the input bits are first complemented so that less than a majority of the stored data bits actually need to be changed, and a complement bit, appended to each word in the MRAM, is set to indicate that the correct logic states of the stored data bits comprising the respective word must be restored upon subsequent readout.

21 Claims, 3 Drawing Sheets

BIT-WISE CONDITIONAL WRITE METHOD AND SYSTEM FOR AN MRAM

FIELD OF THE INVENTION

The present invention relates to integrated circuit (IC) magnetoresistive random access memory (MRAM) systems, and, more specifically, to bit-wise conditional write methods for minimizing power consumption in an IC MRAM system.

BACKGROUND OF THE INVENTION

Although during the Fifties and Sixties magnetic core memories were the predominant storage technology for the working memory of computing systems, they were rapidly supplanted during the Seventies by the integrated circuit random access memory, both static (SRAM) and dynamic (DRAM). The advantages of these newer technologies are well known: microscopic size (contributing to higher operating speeds), miniscule power requirements (requiring dissipation of less waste heat), improved robustness and thus reliability, and manufacturing efficiencies of scale—all of which contributed to the dramatically reduced cost per bit. The disadvantages are equally well known: data volatility, reflected as continuous power dissipation in SRAMs, and as periodic data refresh in DRAMs. To address these problems, various types of non-volatile, read/write memory technologies have been developed, including electrically erasable programmable read only memory (EEPROM), of which Flash memory is, at present, the most popular. All such technologies, however, have additional disadvantages, including finite lifetimes (in terms of write cycles), and power supply requirements which challenge designers of battery powered systems.

Recently, magnetoresistive random access memory (MRAM) cells suitable for fabrication using current integrated circuit manufacturing processes have been developed for use as non-volatile storage elements. Examples of such an MRAM cell suitable for implementation in an IC are shown and described in U.S. Pat. Nos. 5,343,422, 5,917,749, and 5,920,500. A survey of current MRAM technologies and their relative advantages and disadvantages was published by R. Scheuerlein in "Magneto Resistive IC Memory Limitations and Architecture Implications", 1998 International Non-Volatile Memory Technology Conference, IEEE, pp. 47–50 (1998).

In general, MRAM devices of the Magnetic Tunnel Junction (MTJ) type include a multi-layer resistor element comprised of suitable magnetic materials which change its resistance to the flow of electrical current depending upon the direction of magnetic polarization of the layers. In a memory cell, this "bit_resistor" is connected in series with a "bit_read" transistor between a common voltage supply and a "bit_read_write" conductor connected to an input of a "read" sense amplifier. A "word_write" conductor is arranged to intersect, relatively orthogonally, the bit_read_write conductor. The word_write and the bit_read_write conductors are connected to respective word_write and bit_write driver circuits which are selectively enabled such that each conductor conducts only a portion of the current necessary to switch the polarization state of the bit resistor.

During a write operation, each of these "write" currents is generally insufficient to affect the polarization state of any bit_resistor, but, together, at the point of intersection or "coincidence", the currents are sufficient to affect the polarization state of that bit_resistor which is proximate to the intersection of the write conductors. Depending upon the present state of polarization and the relative directions of current flow in the write conductors, the bit_resistor at the coincidence point will either maintain or switch its polarization state.

During a read operation, the bit_read transistor is enabled via a respective word_read conductor, and, simultaneously, the corresponding bit_read sense amplifier is enabled to create a current path from the bit_read_write conductor to the common supply. Since the difference in the resistance value of the bit_resistor is small, the bit_read sense amp must be sufficiently sensitive to recognize the small differences in voltage drop across the bit_resistor associated with the respective polarization states. As was the case with magnetic core memories, an MRAM bit_resistor, once written, will retain its magnetic polarization state indefinitely, with no further input of power. Similarly, there appears to be no practical limit on the number of times that the polarization of the bit_resistor itself can be switched or "written".

One of the unfortunate characteristics of such MRAM cells is the relatively large write currents required to switch the magnetic polarization of the bit_resistor. As improvements in process technologies decrease the cross-sectional area of the write conductors, metal migration effects become significant. Corresponding improvements are needed to reduce the levels of the write currents or the frequency of their application to the MRAM cells.

In U.S. Pat. No. 5,777,923, a method is disclosed for comparing, on a bit-wise basis, the logic state of a data bit stored in a Flash memory cell and the logic state of a respective input bit, and to inhibit that cell during back-to-back erase and program cycles. A principle objective of this method is to prolong the lifetime of each Flash cell by eliminating unnecessary erase and program operations. However, the disclosed method and implementation are not directly applicable to an MRAM system, primarily because of the significantly different techniques for writing the two types of cells.

It is an object of the present invention to provide a method for detecting, on a bit-wise basis, a correspondence between the logic state of a data bit stored in an MRAM cell and the logic state of a respective input bit, and to disable the bit_write driver circuit during a write cycle, thus conserving the bit_write current.

The rapid reduction in structure geometries also increases the likelihood that, in the course of writing a particular MRAM cell, or set of cells, other cells in the array may be inadvertently switched. This is even more likely in the context of one embodiment of the present invention in which one of the pair of write currents to a cell (corresponding to a particular "bit" of a selected multi-bit "word") is disabled because the state of the cell is already correct. Although external error detection and correction (EDAC) technologies may be employed to detect and correct such data corruption, such technologies have well-known limits, and significantly increase system cost, power consumption, etc.

A further object of the present invention is to provide a method for reinforcing, during a write operation, the polarization state of MRAM cells which are not to be changed, thus protecting vulnerable cells.

In a conventional precharge/discharge memory, such as a read-only memory (ROM), a technique has been developed to minimize, on the average, the number of precharged bit lines that are discharged in the course of accessing each multi-bit row. According to this technique, shown and described in U.S. Pat. No. 5,896,335 (which is assigned to the present Assignee, and hereby expressly incorporated herein by reference), the logical state of each bit comprising a word is inverted if, by doing so, the number of precharged bit lines that will be discharged during a read of the row will be minimized. In order to keep track of this selective row-wise bit inversion, a reversion bit is added to each row, and set or reset accordingly. The resulting savings in power dissipation can be quite significant, especially in large memories.

Another object of the present invention is to provide a method, for use in an MRAM system, to minimize, on the average, the number of cells comprising a multi-bit word which must be simultaneously programmed, thus minimizing both the instantaneous, peak and average current draw of the memory.

In addition, the present invention is directed to suitable apparatus for practicing each of the methods disclosed hereinafter.

BRIEF DESCRIPTION OF THE DRAWINGS

The present invention may be more fully understood by a description of certain preferred embodiments in conjunction with the attached drawings in which.

Figure 1:
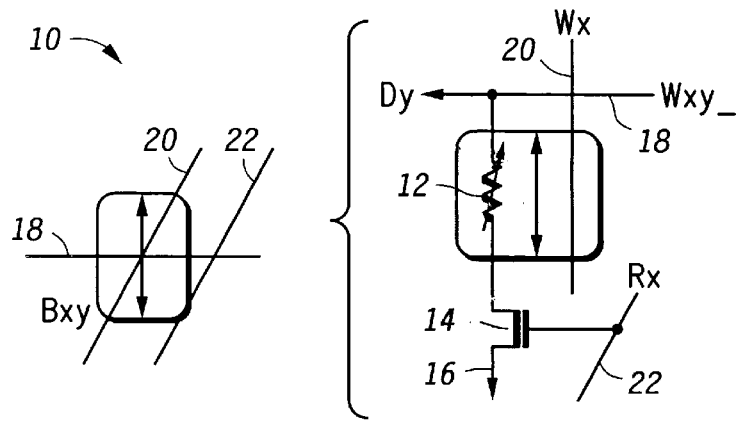
FIG. 1 illustrates in schematic diagram form a conventional magnetoresistive random access memory (MRAM) cell, and the symbology used hereinafter to describe each of the several embodiments of the present invention.

In the following descriptions of the several preferred embodiments of the present invention, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE PREFERRED EMBODIMENTS

According to one aspect of the present invention, in an integrated circuit (IC) magnetic random access memory (MRAM) system having at least one word consisting of at least one data bit, said data bit comprising an MRAM cell which is writeable in a selected one of a first and a second logic state in response to a coincidence of a word_write current and a bit_write current, a method includes the steps of receiving an input bit having one of said first and second logic states; reading said cell to determine the current logic state of said data bit; comparing the logic state of said input bit to the logic state of said data bit; and providing both said word_write current and said bit_write current if the logic state of said input bit is different from the logic state of said data bit.

According to another aspect of the present invention, in an integrated circuit (IC) magnetic random access memory (MRAM) system having at least one word consisting of n data bits, and one complement bit, each of said bits comprising an MRAM cell which is writeable in a selected one of a first and a second logic state in response to a coincidence of a word_write current and a bit_write current, a write method includes the steps of receiving n input bits, each having one of said first and second logic states; reading said cells to determine the current logic states of said data bits and said complement bit; and comparing the logic state of each of said n input bits to the current logic state of a respective one of said n data bits. If the logic states of a majority of said n input bits are different from the logic states of the corresponding ones of said n data bits, the method provides a complement signal in a selected one of said first and second logic states and in response to said complement signal being provided in said selected state, conditionally complementing each of said input bits. The method continues by providing said word_write current; for each of said n data bits, providing said bit_write current if the logic state of the respective one of said conditionally complemented input bits is different from the current logic state of said data bit; and for said complement bit, providing said bit_write current if the logic state of said complement signal is different from the current logic state of said complement bit.

According to still another aspect of the present invention, in an integrated circuit (IC) magnetic random access memory (MRAM) system having at least one word consisting of at least one data bit, said data bit comprising an MRAM cell which is writeable in a selected one of a first and a second logic state in response to a coincidence of a word_write current and a bit_write current, a write control circuit includes a word_write driver circuit which, when enabled, provides said word_write current; a bit_write driver circuit which, when enabled, provides said bit_write current; and a comparison circuit to compare an input bit having one of said first and second logic states to the current logic state of said data bit, and to simultaneously enable said word_write driver circuit and said bit_write driver circuit if the logic state of said input bit is different from the current logic state of said data bit.

Still further in another aspect of the present invention, in an integrated circuit (IC) magnetic random access memory (MRAM) system having at least one word consisting of n data bits, and one complement bit, each of said bits comprising an MRAM cell which is writeable in a selected one of a first and a second logic state in response to a coincidence of a word_write current and a bit_write current, a write control circuit includes a word_write driver circuit which, when enabled, provides said word_write current; n data_ bit_write driver circuits, each of which, when enabled, provides said bit_write current to a respective one of said n data bits; a complement_bit_write driver circuit which, when enabled, provides said bit_write current to said complement bit; a complement circuit which, in response to a complement signal in a predetermined one of said first and second logic states, conditionally complements each of n input bits, each having one of said first and second logic states; a first comparison circuit to compare the current logic state of each of said data bits to the logic state of a respective one of said n input bits, and, if the current logic states of a majority of said n data bits are different from the logic states of the corresponding ones of said n input bits, to provide said complement signal in said predetermined logic state; and a second comparison circuit, connected to the complement circuit and each of said driver circuits, to compare the logic state of each of said conditionally complemented n input bits to the current logic state of a respective one of said n data bits, and to simultaneously enable said word_write driver circuit, said data_bit_write driver circuit of each of said respective n data bits if the current logic state thereof is the different from the logic state of the respective one of said conditionally complemented input bits, and said complement_bit_write driver circuit if the current logic state of said complement bit is different from the logic state of said complement signal.

In one embodiment, in an integrated circuit (IC) random access memory system having at least one word consisting of n data bits, and one complement bit, each of said bits being writeable in a selected one of a first and a second logic state, a word-wise conditional write method includes the steps of receiving n input bits, each having one of said first and second logic states; reading said cells to determine the current logic states of said data bits and said complement bit; comparing the logic state of each of said n input bits to the current logic state of a respective one of said n data bits; if the logic states of a majority of said n input bits are different from the logic states of the corresponding ones of said n data bits, providing a complement signal in a selected one of said first and second logic states; in response to said complement signal being provided in said selected state, conditionally complementing each of said input bits; for each of said n data bits, if the logic state of the respective one of said conditionally complemented input bits is different from the current logic state of said data bit, writing said data bit to the logic state of said respective one of said conditionally complemented input bits; and for said complement bit, if the logic state of said complement signal is different from the current logic state of said complement bit, writing said complement bit to the logic state of said complement signal.

In a conventional IC MRAM cell 10, as shown by way of example in FIG. 1, a bit_resistor 12 is connected in series with a bit_read transistor 14 between a common voltage supply 16 and a bit_read_write conductor 18. A word_write conductor 20 is arranged to intersect, relatively orthogonally, the bit_read_write conductor 18. A word_read conductor 22 is connected to the control gate of the bit_read transistor 14.

In view of the conventional nature of the MRAM cell 10, the symbol shown in the left portion of FIG. 1 will be used hereinafter whenever the cell illustrated in the right portion of FIG. 1 is instantiated in the MRAM systems shown in FIGS. 2, 4 and 6. For convenience of reference, in FIG. 1, the left end of bit_read_write conductor 18 has been labeled "Dy" to indicate that, for example, it provides a path for reading "bit y" of a multi-bit "word x", while the right end has been labeled "Wxy_" to indicate that it also provides a path for the respective bit_write current. Similarly, the word_write conductor 20 and the word_read conductor 22 have been labeled respectively "Wx" and "Rx", to reflect the nomenclature used hereinafter.

Figure 2:
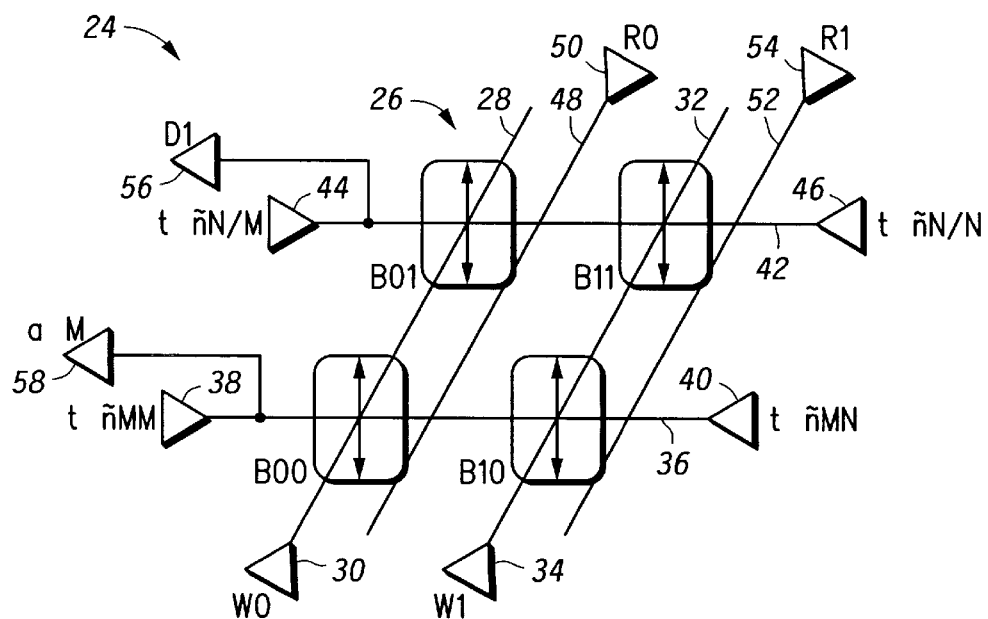
FIG. 2 illustrates in schematic diagram form an MRAM system constructed in accordance with a first embodiment of the present invention.

Shown in FIG. 2, by way of example, is a conventional MRAM system 24 in which Four (4) instantiations of the conventional MRAM cell 10 shown in FIG. 1 have been arranged to form an MRAM array 26 comprising Two (2) words, each consisting of Two (2) data bits, each labeled in accordance with FIG. 1 to indicate the logical position of the respective MRAM cell 10 in the MRAM array 26. In particular, a word_0 is comprised of a first MRAM cell 10, labeled "B00", representing a logical bit_0 of word_0 and a second MRAM cell 10, labeled "B01", representing a logical bit_1 of word_0; and a word_1 is comprised of a third MRAM cell 10, labeled "B10", representing a logical bit_0 of word_1 and a fourth MRAM cell 10, labeled "B11", representing a logical bit_1 of word_1. A word_0_write conductor 28, labeled "W0", is driven by a word_0_write driver circuit 30; and a word_1_write conductor 32, labeled "W1", is driven by a word_1_write driver circuit 34. A bit_0_read_write conductor 36, shared by bit_0 of both word_0 and word_1, is driven in one direction by a bit_0_write_0 driver circuit 38, labeled "Wx0_0", and in a second, opposite direction by a bit_0_write_1 driver circuit 40, labeled "Wx0_1"; whereas a bit_1_read_write conductor 42, shared by bit_1 of both word_0 and word_1, is driven in one direction by a bit_1_write_0 driver circuit 44, labeled "Wx1_0", and in a second, opposite direction by a bit_1_write_1 driver circuit 46, labeled "Wx1_1".

During a conventional write operation of, for example, word_0, the word_0_write driver circuit 30 (W0) is enabled to provide a word_write current via the word_0_write conductor 28. If a data value of 0 is to be written to, for example, bit_0, the bit_0_write_0 driver circuit 38 (Wx0_0) will be simultaneously enabled to provide a bit_write current via the bit_0_read_write conductor 36. Each of these write currents is individually insufficient to affect the polarization state of the B00 MRAM cell 10, but, together, the "coincidence" currents are sufficient to force a predetermined one of the two polarization states. Depending upon the present state of polarization and the relative directions of current flow in the write conductors, the B00 MRAM cell 10 will either maintain or switch its polarization state. In similar fashion, the desired polarization state of the B01 MRAM cell 10 can be established by selectively enabling the appropriate one of the pair of bit_1_write driver circuits. It should be noted that, in a conventional MRAM system 24, at least one of each pair of bit_write driver circuits is enabled every write cycle.

Continuing with the conventional MRAM system 24 of FIG. 2, a word_0_read conductor 48, labeled "R0", is driven by a word_0_read driver circuit 50; while a word_1_read conductor 52, labeled "R1", is driven by a word_1_read driver circuit 54. During a read operation of, for example, word_1, the word_1_read driver circuit 54 enables, for example, the B11 MRAM cell 10 to shunt current between the common supply and the bit_1_read_write conductor 42, and, simultaneously, a bit_1_sense_amplifier 56 is enabled to detect the relative level of the shunt current. Since the difference in the resistance value of the bit_resistor 12 of the B11 MRAM cell 10 is small, the bit_1_sense_amplifier 56 must be sufficiently sensitive to recognize the small differences in voltage drop across the bit_resistor 12 associated with the respective polarization states. In similar fashion, a bit_0_sense_amplifier 58 will detect the level of current flow on bit_0_read_write conductor 36 due to the state of the B10 MRAM cell 10.

It is, of course, apparent that the size of the MRAM array 26 is largely dependent upon the selected manufacturing process. However, as the number of bits comprising MRAM array 26 is increased, the required write drive currents increase rapidly. In accordance with the present invention, it is possible to reduce very significantly the required level of drive currents, both average and instantaneous, although at the expense of a somewhat longer write cycle time.

Figure 3:
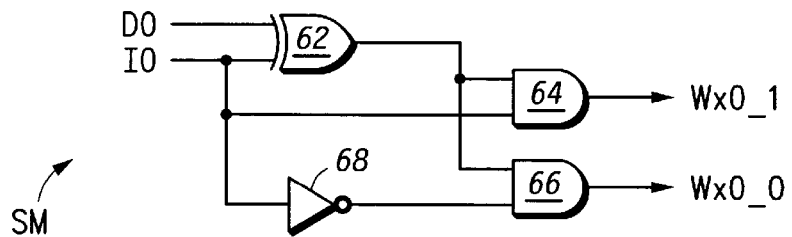
FIG. 3 illustrates in logic diagram form control logic for controlling the MRAM system of FIG. 2 in performing a write operation in accordance with the present invention.

Shown in FIG. 3 is a control circuit 60 constructed in accordance with the first embodiment of the present invention to control the operation during a write cycle of the bit_write driver circuits of the MRAM system 24 of FIG. 2. According to our invention, a write of, for example word_1, is immediately preceded by a read of word_1, so that the current logic state of each bit comprising word_1 can be compared against the logic state of the corresponding bit of the input word. By way of example, in FIG. 3, the current state of bit_0 (D0) is compared to the logic state of input bit_0 (I0) by an Exclusive OR gate (EOR 62). Depending upon this comparison, EOR 62 selectively enables a first AND gate (AND 64) and a second AND gate (AND 66) configured as a 2-to-1 multiplexer to select for output either I0 or the inverse thereof provided by an inverter 68, or neither. Thus, for example, if D0 is a logic_0 and I0 is a logic_1, AND 64 will enable the bit_0_write_1 driver circuit 40 to write a logic_1 into B10; whereas if, instead, D0 is a logic_1 and I0 is a logic_0, AND 66 will enable the bit_0_write_0 driver circuit 38. If, on the other hand, both D0 and I0 have the same logic state, either logic_0 or logic_1, then EOR 62 will disable both AND 64 and AND 66, thus inhibiting both bit_0_write_1 driver circuit 40 and bit_0_write_0 driver circuit 38. As a result, no bit_write drive current is consumed for each and every bit of the selected word which is already in the proper logic (i.e., polarization) state.

It is possible, due to cell and interconnect geometries and process characteristics, that the logic state of a MRAM cell 10 which is not intended to be changed may, inadvertently, be changed as a side effect of changing other adjacent cells in the MRAM array 26. In an MRAM system 70, constructed in accordance with the second embodiment of our invention, as shown in FIG. 4, the logic state of each MRAM cell 10 can be "guarded" against such unintended changes. In particular, a bit_0_guard_0 driver circuit 72, labeled "Wx0_0L", is connected to the bit_0_read_write conductor 36 in parallel with the bit_0_write_0 driver circuit 38 ("Wx0_0H"), and a bit_0_guard_1 driver circuit 74, labeled "Wx0_1L", is connected to the bit_0_read_write conductor 36 in parallel with the bit_0_write_1 driver circuit 40 ("Wx0_1H"). Similarly, a bit_1_guard_0 driver circuit 76, labeled "Wx1_0L", is connected to the bit_1_read_write conductor 42 in parallel with the bit_1_write_0 driver circuit 44 ("Wx1_0H"), and a bit_1_guard_1 driver circuit 78, labeled "Wx1_1L", is connected to the bit_1_read_write conductor 42 in parallel with the bit_1_write_1 driver circuit 46 ("Wx1_1H"). For clarity, the numbers have been omitted for all other elements which are the same as in FIG. 2.

In general, the word_write and bit_write currents tend to be "optimized", in the sense that they are selected so as to guarantee that there will always be sufficient field strength at the point of coincidence to determine the state of the intended MRAM cell 10, even under worst case conditions. Thus, the strength of the field "felt" by other cells in the vicinity of the intended cell may, under adverse conditions, be at or above the level at which the cell will switch. In those situations in which this is the case (either by chance or design), the strength of the guard field generally need not be as large as the original write field. Again, the usual consideration is worst case conditions: the guard field should be sufficient to guarantee that the effective field strength felt by any guarded cell will always be below that cell'switching level. Accordingly, as shown diagrammatically in FIG. 4, the bit_guard drivers can typically be smaller than the respective bit_write drivers. Furthermore, even though we have shown only bit_guard drivers in FIG. 4, we recognize that, as necessary, it may be desirable to provide word_guard drivers as well.

Figure 4:
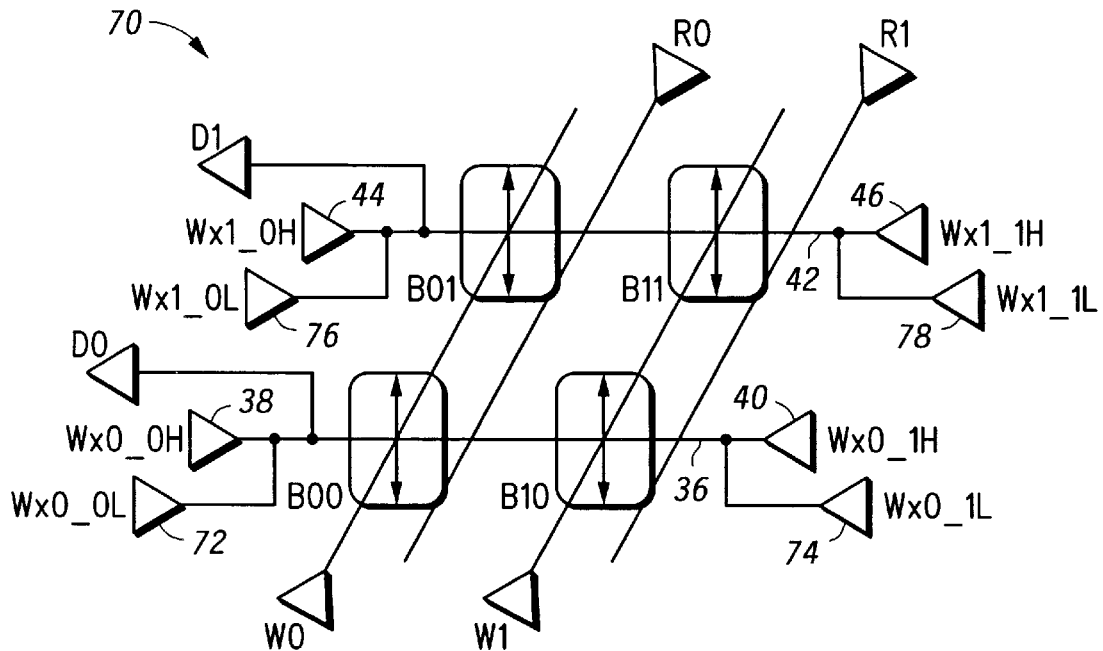
FIG. 4 illustrates in schematic diagram form an MRAM system constructed in accordance with a second embodiment of the present invention.
Figure 5:
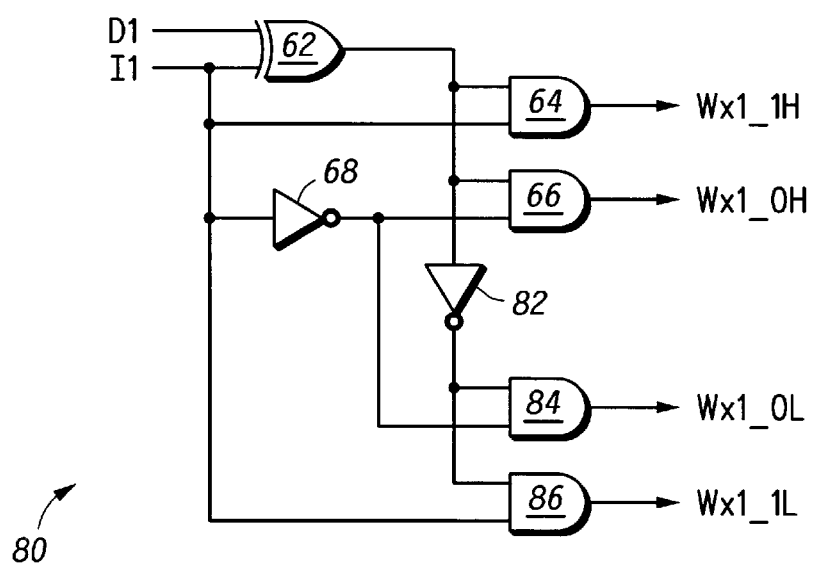
FIG. 5 illustrates in logic diagram form control logic for controlling the MRAM system of FIG. 4 in performing a write operation in accordance with the present invention.

Shown in FIG. 5 is a control circuit 80 constructed in accordance with the second embodiment of the present invention to control the operation during a write cycle of the bit_guard driver circuits of the MRAM system 70 of FIG. 4. According to this embodiment, whenever an MRAM cell 10 is already at the desired logic state, and thus does not need to be changed, the present logic state is "guarded" against unintentional change by a bit_guard current provided by an appropriate one of the pair of bit_guard driver circuits. For example, in response to determining that bit_1 of word_1 of an input signal (I1) and the corresponding bit_1 of word_1 (B11) of the MRAM system 70 (read out as D1) are both in the same logic state, EOR 62 will disable both AND 64 and AND 66. Simultaneously, via an inverter 82, EOR 62 will enable an AND 84 and an AND 86, which are configured as another 2-to-1 multiplexer to pass either I1 or its inverse (provided by the inverter 68). Thus, for example, if D1 is a logic_0 and I1 is also a logic_0, AND 84 will enable the bit_1_guard_0 driver circuit 76 to guard the logic_0 in B11; whereas if, instead, both D1 and I1 are a logic_1, AND 86 will enable the bit_1_guard_1 driver circuit 78 to guard the logic_1 in B11. If, on the other hand, D1 and I1 have different logic states, then EOR 62 will disable both AND 84 and AND 86, thus inhibiting both bit_1_guard_0 driver circuit 76 and bit_1_guard_1 driver circuit 78. Accordingly, in the embodiment shown in FIGS. 4 and 5, there will be no circumstance where one of the bit_guard drivers will be working either in combination with, or in opposition to, one of the bit_write drivers.

Figure 6:
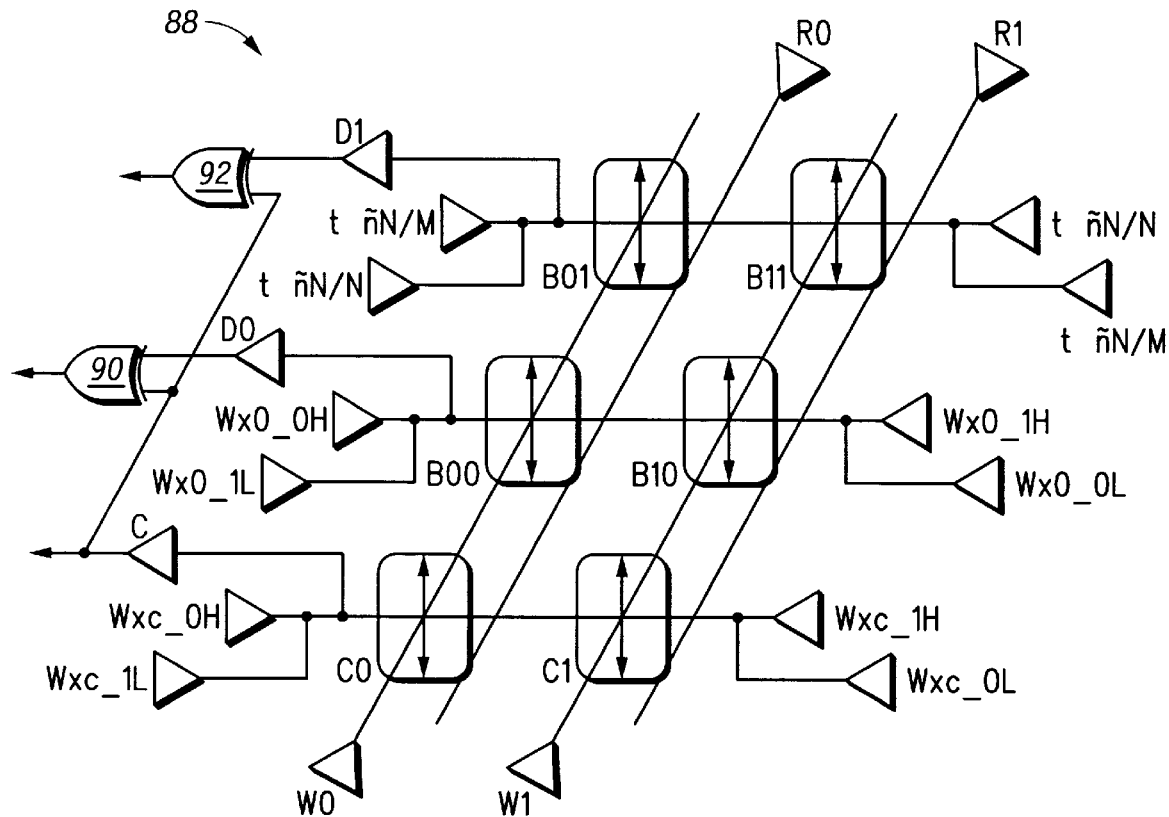
FIG. 6 illustrates in schematic diagram form an MRAM system constructed in accordance with a third embodiment of the present invention.

According to a third embodiment of our invention, shown in FIG. 6, both the average and peak current draw of an MRAM system 88 can be further reduced using a technique similar to that described in U.S. Pat. No. 5,896,335 (see, Background). However, rather than minimizing the number of bit_line discharges per access (by minimizing the number of cells that are at the particular state, either logic_0 or logic_1, which when read completes a discharge path), we minimize the number of bit_line drivers that need to be enabled each write cycle, by minimizing the total number of cells that must be simultaneously changed. For example, in a particular write cycle of the MRAM system 88, assume that B00 and B01 are both in a logic_0 state but that the corresponding input bits I0 and I1 are both in a logic_1 state. In such a case, neither B00 nor B01 will be changed, but rather a word_0_complement_bit, labeled "C0", is set at, for example, a logic_1 state to indicate that the logic states of B00 and B01 should be complemented when read, via an EOR 90 and an EOR 92, respectively. Similarly, a word_1_complement_bit, labeled "C1", maintains a record of the true logic states of the word_1 bits, B10 and B11, so that the correct state may be restored, if necessary, when read. The complement bits are written and read using similar means as the data bits. Again, for clarity, the numbers have been omitted for all other elements which are the same as in FIG. 4.

Figure 7:
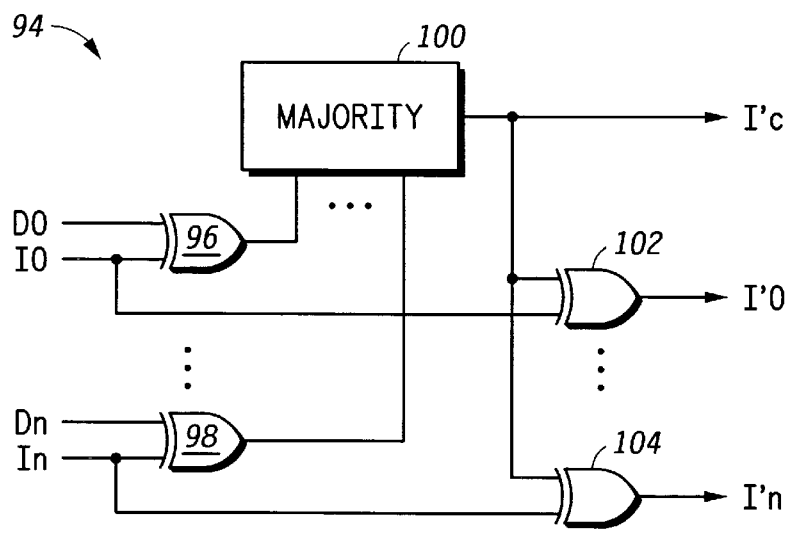
FIG. 7 illustrates in logic diagram form control logic for controlling the MRAM system of FIG. 6 in performing a write operation in accordance with the present invention.

Shown in FIG. 7 is a control circuit 94 constructed in accordance with the third embodiment of the present invention to cooperate with the control circuit 80 to control the operation during a write cycle of the bit driver circuits of the MRAM system 88 of FIG. 6. According to this embodiment, in the course of performing a write of, for example word_1, all of the actual stored bits, read as D0–D1, are compared to the corresponding input bits, I0–I1, by respective EOR 96 and EOR 98. If majority logic circuit 100 determines that more than half of the bits comprising the word, which, in this de minimus case, means both B10 and B11, must be changed, then the input bits I0 and I1 will be conditionally complemented by an EOR 102 and an EOR 104, respectively, and output as "I'0" and "I'1". Essentially, control circuit 94 is responsible for deciding whether or not it would be more efficient to complement each bit of the input word before submitting it to the corresponding input of control circuit 80 of FIG. 5, while the latter is responsible for deciding on a bit-by-bit basis which bits to change (including the complement bit itself) depending upon the conditionally complemented input bits, I'0 and I'1. Using our method, it can be shown that no more than half of the bits (including the complement bit) in any word will need to be changed during any write cycle.

Although our third embodiment has been shown and described in the context of MRAM system 88, which also embodies the first and second embodiments of our invention, it may be used advantageously in other MRAM systems. For example, the bit_guard circuitry may be eliminated if desired. Similarly, the bit-wise conditional write technique may also be eliminated and still realize substantial benefit from our word-wise conditional complement method. However, the time required to perform each write cycle will still include the preliminary read cycle, as well as the critical path through the control circuit 94. In addition, the selected MRAM array 26 would still need to be large enough to accommodate the additional row of word-wise complement bits, and appropriate bit-wise conditional complement logic must be provided to restore, as necessary, the true logic states as they are read from the array. If desired, the digital majority logic may be replaced with suitable analog circuitry, such as current summer with a threshold circuit for detecting when the number of bits that need to be switched exceeds a set level.

In each of the MRAM systems disclosed herein, each pair of bit_write driver circuits, which have been illustrated and described as being disposed at opposite ends of a particular bit_read_write conductor, may, if desired, be disposed at the same end of the respective bit_read_write conductor, and may be integrated into a single, bi-directional bit_write driver. Similarly, the bit_guard drivers may also be combined with, and integrated into, a common multi-level bit driver circuit. Furthermore, the control circuits may be easily modified so that the bit_guard drivers cooperate with the bit_write drivers during a write operation, thus reducing the current drive requirements (i.e., size) of the bit_write drivers. For example, a two-input OR gate (not shown) could be provided to selectively enable each bit_guard driver circuit, with one input connected to receive the respective bit_guard driver enable signal and the other input connected to receive the enable signal of the appropriate bit_write driver circuit. A further reduction in current consumption can be realized by enabling the bit_guard drivers for just those cells that are "at risk" during a particular write operation. Thus, for example, a simple logic circuit could be provided to conditionally enable each bit_guard driver circuit only when one (or both) of the adjacent cells in the same word is being written. In general, such conditional bit_guard control logic can be "tuned" or optimized based upon an analysis of sensitivity testing of the selected array topology, manufacturing process, and anticipated field operating conditions. It will be appreciated that the logical components of the several control circuits described herein can be implemented using any of the well known circuit technologies, including standard combinational logic, array logic, transmission gate logic, or a combination thereof, and that conventional logic minimization and circuit design techniques can be used advantageously to optimize circuit size, path delay, and power dissipation.

Thus it is apparent that there has been provided, in accordance with the present invention, a method for minimizing power consumption in an IC MRAM system. Those skilled in the art will recognize that modifications and variations can be made without departing from the spirit of the invention. In particular, although the present invention has been disclosed herein in the context of an MRAM system of the MTJ type, the invention is equally applicable to other types of MRAM systems, including Giant Magneto Resistive (GMR) and Anisotropic Magneto resistive (AMR). Indeed, our word-wise conditional write method is generally applicable to any memory system (e.g., the Flash memory system shown in U.S. Pat. No. 5,777,923) in which a write operation on a cell consumes a relatively significant amount of power. Therefore, it is intended that this invention encompass all such variations and modifications as fall within the scope of the appended claims.

What is claimed is:

1. In an integrated circuit (IC) magnetic random access memory (MRAM) system having at least one word consisting of at least one data bit, said data bit comprising an MRAM cell which is writeable in a selected one of a first and a second logic state in response to a coincidence of a word_write current and a bit_write current, a method comprising the steps of:

receiving an input bit having one of said first and second logic states;

reading said cell to determine the current logic state of said data bit;

comparing the logic state of said input bit to the logic state of said data bit; and providing both said word_write current and said bit_write current if the logic state of said input bit is different from the logic state of said data bit.

2. The method of claim 1 wherein the logic state to which said cell is writeable is determined by the direction of said bit_write current; and wherein said bit_write current is provided in a first direction to write said data bit to said first logic state and in a second direction to write said data bit to said second logic state.

3. The method of claim 2 wherein said bit_write current is not provided if the logic state of said input bit is the same as the current logic state of said data bit.

4. The method of claim 3 wherein the current logic state of said data bit is guarded in response to a bit_guard current, the method further including the step of:

providing said bit_guard current coincident with said word_write current if the logic state of said input bit is the same as the logic state of said data bit.

5. The method of claim 4 wherein the direction of said bit_guard current is related to the logic state to which said data bit is to be guarded; and wherein said bit_guard current is provided in a first direction to guard said data bit in said first logic state and in a second direction to guard said data bit in said second logic state.

6. In an integrated circuit (IC) magnetic random access memory (MRAM) system having at least one word consisting of n data bits, and one complement bit, each of said bits comprising an MRAM cell which is writeable in a selected one of a first and a second logic state in response to a coincidence of a word_write current and a bit_write current, a write method comprising the steps of:

receiving n input bits, each having one of said first and second logic states;

reading said cells to determine the current logic states of said data bits and said complement bit;

comparing the logic state of each of said n input bits to the current logic state of a respective one of said n data bits;

if the logic states of a majority of said n input bits are different from the logic states of the corresponding ones of said n data bits, providing a complement signal in a selected one of said first and second logic states;

in response to said complement signal being provided in said selected state, conditionally complementing each of said input bits;

providing said word_write current;

for each of said n data bits, providing said bit_write current if the logic state of the respective one of said conditionally complemented input bits is different from the current logic state of said data bit; and for said complement bit, providing said bit_write current if the logic state of said complement signal is different from the current logic state of said complement bit.

7. The method of claim 6 wherein the logic state to which each of said cells is writeable is determined by the direction of the respective bit_write current; and wherein said bit_write current is provided in a first direction to write said data bit to said first logic state and in a second direction to write said data bit to said second logic state.

8. The method of claim 7 wherein each of said bit_write currents is not provided if the logic state of the respective one of said input bits is the same as the current logic state of the respective one of said data bits.

9. The method of claim 8 wherein the current logic state of each of said data bits is guarded in response to a respective bit_guard current, the method further including the step of:

for each of said n data bits, providing said bit_guard current coincident with said word_write current if the logic state of the respective one of said conditionally complemented input bits is the same as the current logic state of said data bit.

10. The method of claim 9 wherein the direction of each of said bit_guard currents is related to the logic state to which the respective one of said data bits is to be guarded; and wherein each bit_guard current is provided in a first direction to guard the respective data bit in said first logic state and in a second direction to guard the respective data bit in said second logic state.

11. In an integrated circuit (IC) magnetic random access memory (MRAM) system having at least one word consisting of at least one data bit, said data bit comprising an MRAM cell which is writeable in a selected one of a first and a second logic state in response to a coincidence of a word_write current and a bit_write current, a write control circuit comprising:

a word_write driver circuit which, when enabled, provides said word_write current;

a bit_write driver circuit which, when enabled, provides said bit_write current; and a comparison circuit to compare an input bit having one of said first and second logic states to the current logic state of said data bit, and to simultaneously enable said word_write driver circuit and said bit_write driver circuit if the logic state of said input bit is different from the current logic state of said data bit.

12. The circuit of claim 11 wherein the logic state to which said cell is writeable is determined by the direction of said bit_write current; wherein said bit_write driver circuit, when enabled, provides said bit_write current in a selected one of a first and a second direction; and wherein said comparison circuit selectively enables said bit_write driver circuit to provide said bit_write current in said first direction to write said data bit to said first logic state and in said second direction to write said data bit to said second logic state.

13. The circuit of claim 12 wherein said bit_write current is not provided if the logic state of said input bit is the same as the current logic state of said data bit.

14. The circuit of claim 13 wherein the current logic state of said data bit is guarded in response to a bit_guard current, the circuit further including:

a bit_guard driver circuit which, when enabled, provides said bit_guard current; and wherein the comparison circuit enables said bit_guard circuit to provide said bit_guard current coincident with said word_write current if the logic state of said input bit is the same as the current logic state of said data bit.

15. The circuit of claim 14 wherein the direction of said bit_guard current is related to the logic state to which said data bit is to be guarded; wherein said bit_guard driver circuit, when enabled, provides said bit_guard current in a selected one of a first and a second direction; and wherein said comparison circuit selectively enables said bit_guard driver circuit to provide said bit_guard current in said first direction to guard said data bit in said first logic state and in said second direction to guard said data bit in said second logic state.

16. In an integrated circuit (IC) magnetic random access memory (MRAM) system having at least one word consisting of n data bits, and one complement bit, each of said bits comprising an MRAM cell which is writeable in a selected one of a first and a second logic state in response to a coincidence of a word_write current and a bit_write current, a write control circuit comprising:

a word_write driver circuit which, when enabled, provides said word_write current;

n data_bit_write driver circuits, each of which, when enabled, provides said bit_write current to a respective one of said n data bits;

a complement_bit_write driver circuit which, when enabled, provides said bit_write current to said complement bit;

a complement circuit which, in response to a complement signal in a predetermined one of said first and second logic states, conditionally complements each of n input bits, each having one of said first and second logic states;

a first comparison circuit to compare the current logic state of each of said data bits to the logic state of a respective one of said n input bits, and, if the current logic states of a majority of said n data bits are different from the logic states of the corresponding ones of said n input bits, to provide said complement signal in said predetermined logic state; and a second comparison circuit, connected to the complement circuit and each of said driver circuits, to compare the logic state of each of said conditionally complemented n input bits to the current logic state of a respective one of said n data bits, and to simultaneously enable:

said word_write driver circuit;

said data_bit_write driver circuit of each of said respective n data bits if the current logic state thereof is the different from the logic state of the respective one of said conditionally complemented input bits; and said complement_bit_write driver circuit if the current logic state of said complement bit is different from the logic state of said complement signal.

17. The circuit of claim 16 wherein the logic state to which each of said cells is writeable is determined by the direction of the respective bit_write current; wherein each of said bit_write driver circuits, when enabled, provide said respective bit_write current in a selected one of a first and a second direction; and wherein said comparison circuit selectively enables each of said bit_write driver circuits to provide said respective bit_write current in said first direction to write said respective data bit to said first logic state and in said second direction to write said respective data bit to said second logic state.

18. The circuit of claim 17 wherein each of said bit_write currents is not provided if the logic state of the respective one of said conditionally complemented input bits is the same as the current logic state of the respective one of said data bits.

19. The circuit of claim 18 wherein the current logic state of each of said data bits is guarded in response to a respective bit_guard current, the circuit further including:

n bit_guard driver circuits, each of which, when enabled, provides said bit_guard current to a respective one of said data bits; and wherein the comparison circuit enables said bit_guard circuit to provide said bit_guard current coincident with said word_write current if the logic state of said conditionally complemented input bit is the same as the current logic state of said data bit.

20. The circuit of claim 19 wherein the direction of each of said bit_guard currents is related to the logic state to which the respective one of said data bits is to be guarded; wherein each of said bit_guard driver circuits, when enabled, provides said bit_guard current to a respective one of said data bits in a selected one of a first and a second direction; and wherein said comparison circuit selectively enables each of said bit_guard driver circuits to provide said bit_guard current in said first direction to guard said respective data bit in said first logic state and in said second direction to guard said respective data bit in said second logic state.

21. In an integrated circuit (IC) random access memory system having at least one word consisting of n data bits, and one complement bit, each of said bits being writeable in a selected one of a first and a second logic state, a word-wise conditional write method comprising the steps of:

receiving n input bits, each having one of said first and second logic states;

reading said cells to determine the current logic states of said data bits and said complement bit;

comparing the logic state of each of said n input bits to the current logic state of a respective one of said n data bits;

if the logic states of a majority of said n input bits are different from the logic states of the corresponding ones of said n data bits, providing a complement signal in a selected one of said first and second logic states;

in response to said complement signal being provided in said selected state, conditionally complementing each of said input bits;

for each of said n data bits, if the logic state of the respective one of said conditionally complemented input bits is different from the current logic state of said data bit, writing said data bit to the logic state of said respective one of said complemented input bits; and for said complement bit, if the logic state of said complement signal is different from the current logic state of said complement bit, writing said complement bit to the logic state of said complement signal.

* * * * *